INVENTOR.
HERMAN F. HOEGEMAN JR.
BY C. A. Gulbrandsen
ATTY.

INVENTOR.
HERMAN F. HOEGEMAN JR.
BY
[signature]
ATTY.

United States Patent Office 3,173,094
Patented Mar. 9, 1965

3,173,094

ELECTRONIC DISTRIBUTOR FOR EITHER SERIAL INPUT TO PARALLEL OUTPUT OR PARALLEL INPUT TO SERIAL OUTPUT

Herman F. Hoegeman, Jr., Baltimore, Md., assignor to Automatic Electric Laboratories, Inc., Northlake, Ill., a corporation of Delaware Filed Apr. 13, 1962, Ser. No. 187,353
9 Claims. (Cl. 328—103)

This invention relates to electronic distributors and more particularly to a device for use in telegraph signalling systems where it may be found advantageous to convert parallel signals to serial form and serial signals to parallel form.

The use of distributors or converters for the sequential selection and serial transmission of parallel signals in telegraphy is well known. Alternatively the use of such devices for translation of serial signals to parallel signals is also well known.

Prior distributors have been largely mechanical in action. These devices are characterized by constant wear and the need for considerable and frequent adjustment. Speed too in mechanical distributors is limited by the structures utilized.

Accordingly the object of this invention is the provision of a fully electronic distributor for use in telegraph systems.

A feature of the instant invention is electronic circuitry usable for conversion of parallel code signals to serial code signals.

A second feature of the instant invention is electronic circuitry usable for conversion of serial code signals to parallel code signals.

Another feature shall be the provision of electronic clock circuitry for proper spacial distribution of signals handled by a telegraph system.

Yet another feature shall be the provision of electronic distributor circuitry that is the equivalent of a mechanical distributor used in sequential selection of individual circuits and connecting them to a common line or circuit.

Still another feature is an electronic circuit capable of connecting signals from a plurality of sources to a common circuit or line in sequential order.

The invention both as to its organization and method of operation together with further objects and advantages thereof will best be understood by reference to the following specification taken in connection with the accompanying drawings in which.

Figure 1:
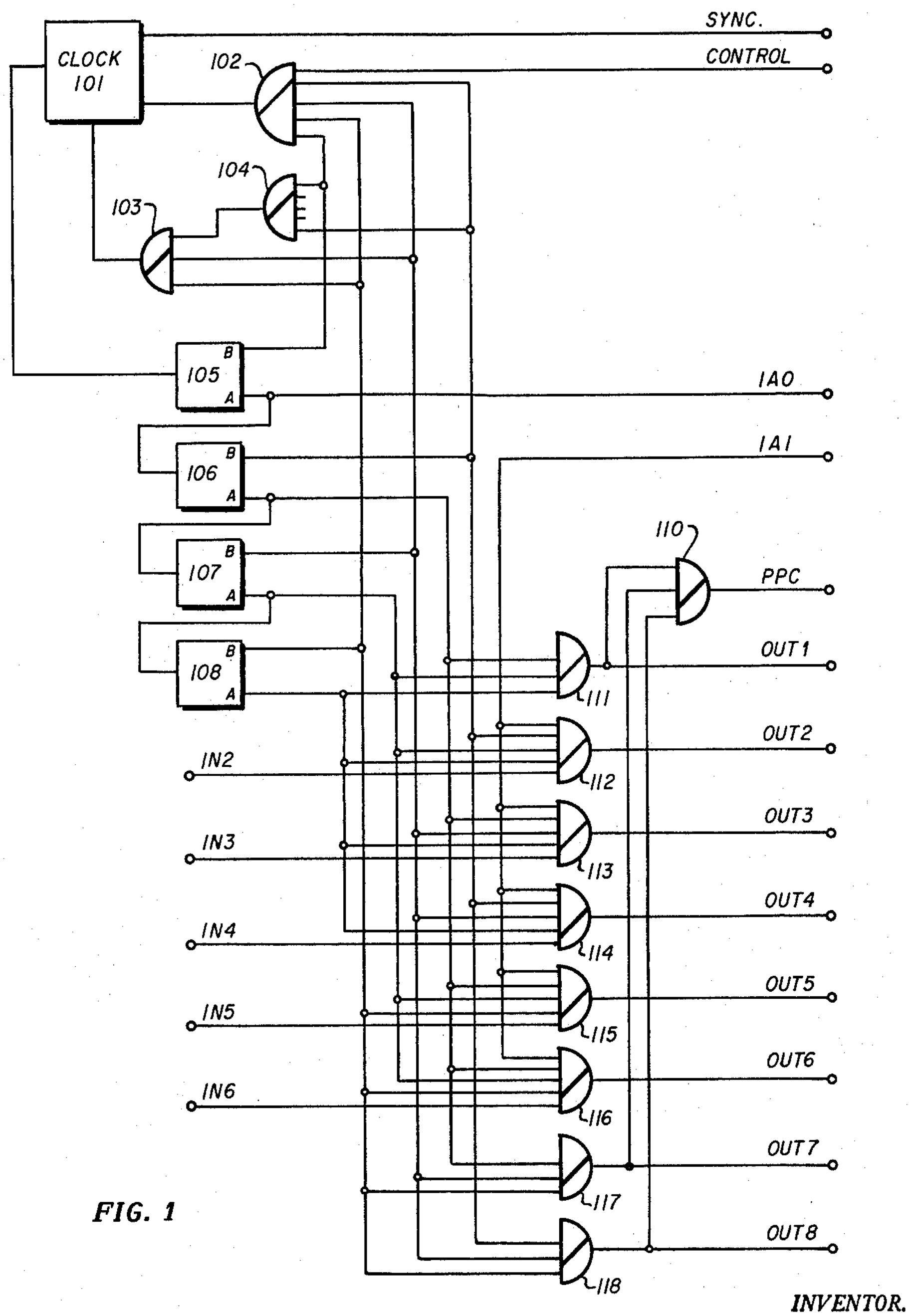
FIG. 1 is a diagrammatic representation of an electronic distributor according to the present invention.
Figure 2:
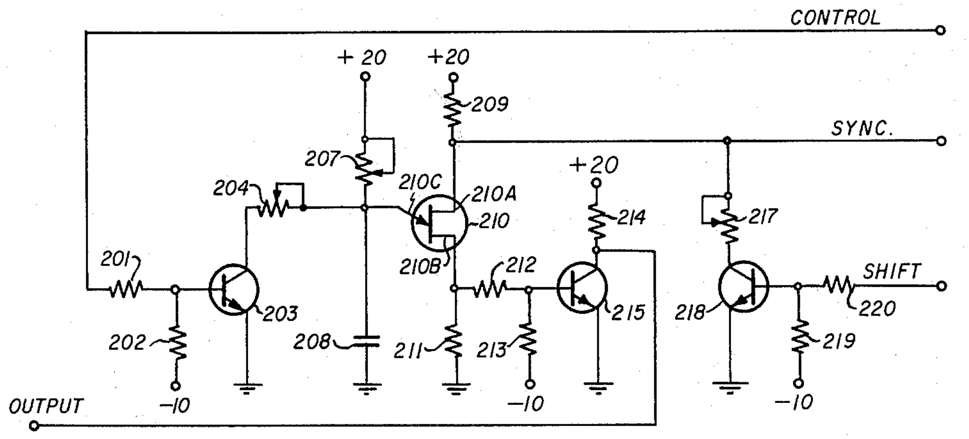
FIG. 2 is a schematic circuit diagram of a clock or control for an electronic distributor in accordance with the present invention.
Figure 3:
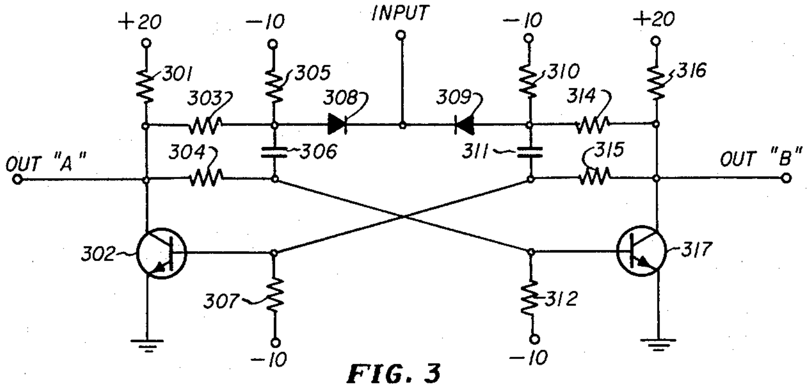
FIG. 3 is a schematic circuit diagram of a flip-flop usable in an electronic distributor in accordance with the present invention.
Figure 4:
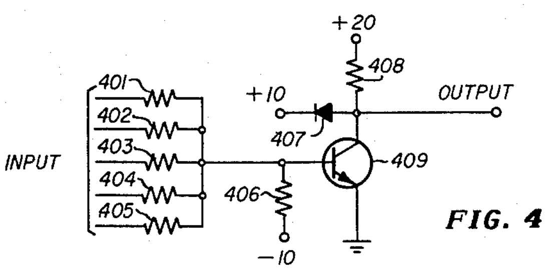
FIG. 4 is a schematic diagram of a gate circuit usable in an electronic distributor in accordance with the present invention.

As shown in FIG. 1 the electronic distributor includes the clock circuit 101, shown in detail in FIG. 2, the counter circuit consisting of flip-flops 105, 106, 107 and 108, and the gate circuits 102, 103, 104 and 110 to 118 inclusive. Detailed flip-flop circuitry is shown in FIG. 3. A gate circuit is shown in detail in FIG. 4. These circuits are interconnected as shown in FIG. 1 to provide the data distributing and coding functions of the instant invention.

The clock circuit 101 is the source of pulses which drive the counting chain made up of counters 105 to

108. The outputs of these counters then enable in the desired time sequence the various gate circuits. When a gate is enabled all of its inputs are in the "0" (ground) condition. Conversely, a gate is disabled if one or more of its inputs are in the "1" (+V) condition.

The clock circuit is controlled as shown in FIG. 2 by means of a "1" or "0" marking on the CONTROL lead. A "1" mark on this lead causes transistor 203 to conduct. This in turn clamps the emitter 210C of unijunction transistor 210 to a voltage determined by voltage divider consisting of resistances 204, and 207. Capacitor 208 will charge toward this voltage but no higher. Since the emitter 210C of transistor 210 must reach a certain preset voltage, (the peak point voltage) before a pulse is generated by transistor 210, no pulses will be generated while the emitter voltage is clamped below this peak point voltage by the action of transistor 203 and resistances 204 and 205. A varying amount of time delay between the appearance of a "0" mark on the CONTROL lead and the generation of the first pulse can be achieved by varying the ratio of resistor 204 to resistor 207. The larger this ratio the smaller the time delay becomes until control of the clock circuit is lost. The usefulness of this time delay will be explained later.

The frequency of the clock pulses is determined by two factors the first is the product of the time constant of resistance 207 and capacitance 208. The second is the voltage difference between base 210A and base 210B of unijunction transistor 210. The charge on capacitor 208 builds up through resistance 207 and the voltage at the emitter 210C of transistor 210 rises with it until the peak point voltage is reached. The emitter 210C, base 210A diode then suddenly becomes forward biased and capacitor 208 discharges through resistor 211 creating a voltage pulse across resistor 211 which is inverted by transistor 215. The smaller the time constant the higher the pulse frequency and vice versa. When the base 210A, base 210B voltage varies the peak point voltage varies. The greater the voltage difference, the greater the point voltage and the lower the pulse frequency for a fixed time constant. This interbase voltage is changed by means of transistor 218. When a "1" marking is placed on the SHIFT lead, transistor 218 saturates and the voltage at base 210B is reduced by an amount determined by the value of resistance 217. The larger the value of resistance 217 the smaller the voltage change and vice versa. Thus it is possible to continuously vary the pulse frequency by means of varying capacitance 208 or resistance 207 and also to make abrupt shifts to another preset frequency. The basic frequency is determined by the product of resistances 204 and 207 while the amount of frequency shift is dependent upon the value of resistance 217. While there are certain limitations placed on the values of resistances 204, 207 and 217 to insure reliable operation, the circuit is still capable of operating over a very wide range of frequencies, so that these limitations are not serious at the frequencies of operation involved in the instant invention.

If very close synchronization is desired between the clock circuit shown in FIG. 2 and some other unit a pulse on the "SYNC" lead will trigger the clock immediately and produce an output almost simultaneous with the input pulse.

The output of the clock circuit shown in FIG. 2 is used to advance a four stage counter. This counter is comprised of counters 105, 106, 107 and 108. Detailed circuitry as used in any one of these counters is shown in FIG. 3. Referring now to FIG. 3 the pulses in the clock are fed alternately to the two bases of the transistors 302 and 317 that form the counter. These pulses are fed from the input terminal through steering diodes 308 or 309 and capacitors 306 or 311 to the base of the conducting transistor and shutting it off. Thus two input pulses are required for the counterstage to complete one output pulse. This output pulse drives counter 106 which in turn drives counting stage 107 and 107 alternately is used to drive counter 108. The time duration of the various counter stage outputs is thus determined by the length of the time between successive input pulses and the 16 pulse clock interval is therefore subdivided into 16 intervals of time by using all of the possible combinations of the four counter stages 105–108 outputs.

The counter stages 105–108 outputs drive the various gate circuits 102–104 and 110–118 as shown in FIG. 1 to achieve both parallel to serial encoding and serial to parallel encoding. The gate circuits are standard NOR logic configurations. In order to get a "1" output every input lead must be marked with a "0" marking. Whereas if one or more inputs are marked with a "1," the output is always a "0." The basic function of the electronic distributor is to partially enable gates 111–118 in a definite time sequence. In this condition all of the inputs to gaes 111–118 except the IN lead are marked with a "0" marking. Thus the output of each of gates 111–118 is then determined strictly by the data marking on its "IN" lead and it is strictly segregated timewise from all other gate outputs.

Upon using the electronic distributor as a parallel to serial encoding device which would be useful in a teletypewriter system, lead 1A is grounded and the output terminals 1 through 8 are common to the line. The five data bits which make up the character to be transmitted are fed to the electronic distributor in the form of "1" and "0" signals on the IN leads 2–6 from a suitable storage medium such as a strapped rotary switch, magnetic tape, etc. Transmission of this character out over the line is initiated by changing the marking on the control lead from a "0" to a "1" marking.

The electronic distributor will continue to encode and transmit whatever markings appear on the IN leads until the "1" marking on the CONTROL lead is changed to a "0." When this happens the distributor will complete transmission of the character it is now handling and then stop. A "1" marking on the CONTROL lead disables gate 102 since all inputs to this gate circuit are not "0." Disabling of gate 102 places a "0" on the clock CONTROL lead for the clock circuit shown in FIG. 2. As explained previously this permits the first clock pulse to appear after the preset delay. This pulse advances the counting chain. The counter outputs are now such that gate 118 is disabled which removes the stop indication from the line. Gate 111 is enabled during the disabling of gate 110. The removal of the stop indication is the beginning of the "start" pulse of a new character. Once the first clock pulse is generated the electronic distributor is tripped and it will finish its 16 pulse cycle (one complete character) regardless of any marking change on the CONTROL lead.

A second clock pulse of the clock 101 will advance the count but no change in any of the gate circuits 111–118 occurs. The third clock pulse advances the count, disabling gate 111 and partially enabling gate 112. This marks the end of the start pulse on the line. Gate 110 is enabled and the beginning of a pulse per character marking appears on its output lead PPC. If a "0" data marking is on lead IN2 gate 112 will be enabled and a "mark" will be transmitted on the line as the first data bit of the character. If a "1" data marking is one the IN2 input gate 112 will remain disabled and a "space" will be transmitted. The fourth clock pulse advances the count but no change occurs in the condition of any of the gates. The above sequence is followed for clock pulses 5 through 12 during which time the data contained on input leads IN3 through IN6 is transmitted to the line in the proper time intervals.

The thirteenth clock pulse advances the count so that gate 117 and gate 103 are enabled. This marks the beginning of the "stop" pulse which is transmitted through gate 117. At the same time gate 103 puts a "1" marking on the SHIFT lead of clock 101 shown in detail in FIG. 2. This changes the clock frequency so that the remaining four pulses in the sixteen pulse clock cycle generate the exact length "stop" pulse required by the teletypewriter code being used. Thus any code can be generated simply by pre-setting the necessary amount of frequency shift which occurs at the twelfth clock pulse. The "1" output of gate 117 also disables gate 110 which in turn terminates the pulse per character marking on its output lead PPC which is connected to the storage medium control. This pulse per character is normally used to indicate that transmission of a character has been completed and to effect a change of data markings on the IN leads to correspond to the next character to be transmitted. The fourteenth clock pulse advances the count but no change occurs in any gate. The fifteenth clock pulse is generated and gate 117 is disabled while gate 118 is enabled. Gate 118 maintains the "stop" indication on the line and also maintains gate 110 disabled. The sixteenth and final clock pulse of the cycle advances the counting chain to its starting position and gate 118 remains enabled, holding the line in the "stop" condition, and gate 110 disabled. The combined outputs of the counting chain counters 105–108 and enabled gate 104, disable gate 103 allowing the clock 101 to resume its initial frequency at the beginning of the next sixteenth pulse cycle. Gate 102 is partially enabled at this time. If a "1" marking is applied to the CONTROL lead at this time, indicating a new character to be transmitted, gate 102 remains disabled and a new sixteen pulse cycle is started by its clock 101. If a "0" marking appears on the CONTROL lead gate 102 is enabled and a new cycle is not started until such time as this marking is changed to a "1." The electronic distributor is now in its rest condition.

To utilize the electronic distributor for serial to parallel encoding the input leads IN2 to IN6 and the CONTROL lead are connected together and lead 1A0 is strapped to lead 1A1. Markings corresponding to the incoming line signals are then placed on these commoned leads. The mark conditions on the line are indicated by a "1" marking and a "0" for a "space" condition.

When the start pulse of an incoming character is detected the marking on the common leads changes to a "1" marking. Gate 102 is disabled and a "0" marking is placed on clock 101 CONTROL lead. After the preset time delay the first clock pulse is generated. The reason for this time delay is two fold. First if the line had momentarily gone to the space condition as the result of a line transient, the electronic distributor might mistake this for a "start" pulse and an error will be made. By requiring that the lines stay in the space condition continuously for the time of this present delay, before the electronic distributor is tripped this error is avoided. Only a true "start" pulse would be of sufficient length. The second purpose of the time delay is to enable the electronic distributor to sample the incoming data in the center of each marking and to ignore the first and fourth quarters of the signal which are often badly distorted. Once the first clock pulse is generated the clock will complete the other 15 pulses in the cycle before stopping.

The first clock pulse advances the counter in the manner described before disabling the gate 102 making the clock's operation independent of any marking on the CONTROL lead. Gate 111 is enabled and a "1" marking is placed on output lead OUT1. Gate 118 is disabled which changes the marking on output lead OUT8 from "1" to "0" marking. The second clock pulse advances the count, and gate 111 is disabled. This in turn enables gate 110 and the PPC output goes to the "1" condition marking the beginning of the pulse per character. The third clock pulse advances the counter and gate 112 is partially enabled. If the first data of the incoming character is a "space" marking, all the IN leads are marked with a "1" and gate 112 remains disabled. If the line is in the "mark" condition at this time only gate 112 will be enabled. Thus the first data bit is channeled through gate 112 and is represented as a "1" signal for a "mark" indication or a "0" marking for "space" condition on output lead OUT2. The fourth clock pulse advances the counter disabling gate 112 if it were previously enabled. In like manner added bits 2 to 5 of the incoming character are decoded into markings on leads OUT3 to OUT6 respectively using clock pulses 5 to 12. The thirteenth clock pulse advances the counter enabling gate 117 giving a "1" marking on output lead OUT7. Gate 110 is disabled and changes the "1" marking on output lead PPC to a "0" marking, ending the pulse per character indication. Gate 104 is disabled and gate 103 is enabled by the counter. This places a "1" marking on the clock shift lead and the pulse frequency of the clock is changed so that the remaining four pulses of the cycle make up the the proper "stop" pulse interval. This frequency is set so that the clock will finish its sixteenth pulse cycle well within the character length of the incoming signal. This assures that the electronic distributor remains synchronized with the transmitting unit.

The fourteenth clock pulse advances the count and no changes occur in any of the gate circuits 111–118 outputs. The fifteenth clock pulse advances the count so that gate 118 is enabled and gate 117 disabled. The sixteenth clock pulse advances the count which enables gate 104. This in turn disables gate 103 and the clock frequency reverts to its initial value for the beginning of the next character. Gate 102 is enabled by the counter and the "0" marking on the CONTROL lead. This "0" marking comes from the fact that the "stop" pulse (a mark) is on the incoming line. Gate 102 places a "1" mark on gate 101 CONTROL lead stopping the generation of pulses. The electronic distributor is now at rest awaiting the next start pulse.

What is claimed is:

1. An electronic distributor for conversion of parallel signals to series signals and series signals to parallel signals comprising: a pulse source operated to provide a continuous train of clock pulses of similar polarity, duration and frequency; a first and a second plurality of gate circuits, each of said gate circuits including a plurality of enabling pulse inputs, and a signal pulse output terminal, and each of said first plurality of gate circuits further including a signal pulse input terminal; counting means including a plurality of outputs connected to said gate circuit enabling pulse inputs, and a circuit connection to said pulse source, operated in response to clock pulses received over said connection from said pulse source to extend cyclically recurring individual enabling pulses to said gate circuits; and means in said first plurality of gate circuits enabled in response to said enabling pulses and concurrent pulses of similar polarity at said signal input terminals to supply signal pulses at said signal output terminals, and means in said second plurality of gate circuits enabled in response only to said enabling pulses to supply signal pulses at said signal output terminals.

2. An electronic distributor as claimed in claim 1 wherein said pulse source includes a control terminal, and is operated in response to application of a start pulse of a predetermined polarity at said control terminal.

3. An electronic distributor as claimed in claim 1 wherein said pulse source includes a synchronizing terminal, and is further operated in response to application of an alignment pulse of predetermined polarity at said synchronizing terminal to align said clock pulses with said alignment pulse.

4. An electronic distributor as claimed in claim 1 wherein said counting means include a concatenated series of bistable multivibrators, said series having an input including said circuit connection to said pulse source and further connected to said plurality of outputs.

5. Counting means as claimed in claim 4 wherein said concatenated series of bistable multivibrators each include a pair of output connections, said first one of said plurality of bistable multivibrators has its input connected by said circuit connection to said pulse source and the remaining multivibrators of said plurality each have their inputs connected to a different one of said multivibrators in concatenated manner.

6. An electronic distributor for conversion of parallel signals to series signals and series signals to parallel signals comprising: a pulse source operated to provide a continuous train of clock pulses of similar polarity, duration and frequency; a plurality of gate circuits, including a plurality of enabling pulse inputs, a plurality of signal pulse input terminals, and a plurality of signal pulse output terminals; counting means including a plurality of outputs connected to said gate circuit enabling pulse inputs, and a circuit connection to said pulse source, operated in response to clock pulses received over said connection from said pulse source to extend cyclically recurring individual enabling pulses to said gate circuits; means in said gate circuits enabled in response to said enabling pulses and concurrent pulses of similar polarity at said signal input terminals to supply signal pulses at said signal output terminals; and shift means including a plurality of gate circuits having their output connected to said pulse source, and their inputs connected to said counting means, operated in response to concurrent enabling pulses of similar polarity at said inputs to extend a shift pulse to said pulse source, said pulse source further operated in response to said shift pulse to shift the frequency of said clock pulses.

7. An electronic distributor for conversion of parallel signals to series signals and series signals to parallel signals comprising: a pulse source operated to provide a continuous train of clock pulses of similar polarity duration and frequency; multistage counting means having its input connected to said pulse source and a plurality of outputs, operated in response to clock pulses from said pulse source to supply cyclically recurring individual enabling pulses at each of said outputs, shift means having an output connected to said pulse source, a plurality of inputs connected to said counting means, operated in response to concurrent enabling pulses of similar polarity at said inputs to extend a shift pulse to said pulse source, said pulse source further operated in response to said shift pulse to shift the frequency of said clock pulses; a first plurality of gate circuits each having a signal output terminal and a plurality of inputs connected to said counting means each operated in response to concurrent enabling pulses of similar polarity received from said counting means to provide a signal pulse at said signal output terminal; a second plurality of gate circuits each having a signal output terminal, a signal input terminal, and a plurality of inputs connected to said counting means, each operated in response to concurrent enabling pulses received from said counting means and a signal pulse of similar polarity at said signal input terminal, to provide a signal pulse at said signal output terminal.

8. An electronic distributor for conversion of parallel signals to series signals and series signals to parallel signals comprising: a pulse source having a control terminal, a synchronizing terminal and an output terminal, operated in response to application of a start pulse of a predetermined polarity at said control terminal to provide a continuous train of clock pulses of similar polarity duration and frequency, and further operated in response to application of an alignment pulse of predetermined polarity at said synchronizing terminal to align said clock pulses with said alignment pulse; multistage counting means including a concatenated series of bistable multivibrators having an input connected to said pulse source, and a plurality of outputs, operated in response to enabling pulses from said pulse source to supply cyclically recurring individual enabling pulses at each of said outputs; shift means including a plurality of gate circuits having an output connected to said pulse source and their inputs connected to said counting means, operated in response to concurrent enabling pulses of similar polarity at said inputs to extend a shift pulse to said pulse source, said pulse source further operated in response to said shift pulse to shift the frequency of said clock pulses; a first plurality of gate circuits each having a signal output terminal and a plurality of inputs connected to said counting means, each operated in response to concurrent enabling pulses of similar polarity received at said counting means to provide a signal pulse at said signal output terminal; a second plurality of gate circuits each having a signal output terminal, a signal input terminal and a plurality of inputs connected to said counting means, each operated in response to enabling pulses received from said counting means and a signal pulse of similar polarity received at said signal input terminal to provide a signal pulse at said signal output terminal.

9. An electronic distributor for conversion of parallel signals to series signals and series signals to parallel signals comprising: a pulse source including a control terminal, a synchronizing terminal and an output terminal, operated in response to application of a start pulse of a predetermined polarity at said control terminal to provide a continuous train of clock pulses of similar polarity, duration and frequency, and further operated in response to application of an alignment pulse of predetermined polarity at said synchronizing terminal to align said clock pulses with said alignment pulse; multistage counting means including a concatenated series of bistable multivibrators each having a pair of outputs wherein a first one of said plurality of bistable multivibrators has its inputs connected to said pulse source and the remaining multivibrators of said plurality each having their inputs connected to a different one of said multivibrators in concatenated manner, said multivibrators operated in response to clock pulses from said pulse source to supply cyclically recurring individual enabling pulses at each of said outputs in a sequential manner; shift means including a plurality of gate circuits having their output connected to said pulse source and their inputs connected to said counter multivibrator outputs, operated in response to concurrent enabling pulses of similar polarity at said inputs to extend a shift pulse to said pulse source, said pulse source further operated in response to said shift pulse to shift the frequency of said clock pulses; a first plurality of gate circuits each having a signal output terminal and a plurality of inputs connected to a plurality of said counter multivibrator outputs, each operated in response to concurrent enabling pulses of similar polarity received from said counter multivibrators to provide a signal pulse at said signal output terminal; a second plurality of gate circuits each having a signal output terminal, a signal input terminal and a plurality of inputs connected to a plurality of said counter multivibrator outputs each operated in response to enabling pulses received from said counter multivibrators, and a signal pulse of similar polarity at said signal input terminal, to provide a signal pulse at said signal output terminal.

References Cited by the Examiner

UNITED STATES PATENTS 3,054,960 9/62 Pearlman ............ 328—106

ARTHUR GAUSS, *Primary Examiner.*